(12) United States Patent
Atmur (10) Patent No.: US 7,068,097 B2
(45) Date of Patent: Jun. 27, 2006

(54) HIGH FREQUENCY HIGH POWER H-BRIDGE POWER AMPLIFIER

(75) Inventor: Robert J. Atmur, Whittier, CA (US)

(73) Assignee: The Boeing Company, Chicago, IL (US)

( * ) Notice: Subject to any disclaimer, the term of this patent is extended or adjusted under 35 U.S.C. 154(b) by 94 days.

(21) Appl. No.: 10/742,144

(22) Filed: Dec. 18, 2003

(65) Prior Publication Data

US 2005/0134372 A1 Jun. 23, 2005

(51) Int. Cl.
*H03F 3/38* (2006.01)
(52) U.S. Cl. .................. 330/10; 330/251; 330/207 A
(58) Field of Classification Search .................. 330/10, 330/251, 207 A
See application file for complete search history.

(56) References Cited

U.S. PATENT DOCUMENTS

| | | | |
|---|---|---|---|
| 5,291,194 A | | 3/1994 | Ames |
| 5,566,063 A | * | 10/1996 | Gerster et al. ............... 363/98 |
| 5,646,366 A | | 7/1997 | O'Connell |
| 5,748,102 A | | 5/1998 | Barron |
| 5,990,735 A | * | 11/1999 | Sigmon et al. ............... 330/10 |
| 6,140,873 A | * | 10/2000 | Van Groningen ............ 330/10 |
| 6,166,602 A | * | 12/2000 | Steigerwald et al. ........ 330/251 |
| 6,172,550 B1 | * | 1/2001 | Gold et al. .................. 327/366 |
| 6,331,759 B1 | | 12/2001 | Atmur |
| 6,469,916 B1 | * | 10/2002 | Kerkman et al. ............. 363/41 |
| 6,482,054 B1 | | 11/2002 | Treaster et al. |
| 6,536,365 B1 | | 3/2003 | Horton |
| 6,600,695 B1 | | 7/2003 | Nugent et al. |
| 6,642,683 B1 | | 11/2003 | Atmur |
| 6,788,137 B1 | * | 9/2004 | Morita ........................ 330/10 |
| 2003/0001538 A1 | | 1/2003 | Atmur |
| 2003/0103771 A1 | | 6/2003 | Atmur et al. |
| 2003/0218438 A1 | | 11/2003 | Atmur |

OTHER PUBLICATIONS

Helduser, S., and Bonefeld, R., *Active Damping in Civil Engineering Using Hydraulic Actuators*, Institute of Fluid Power and Motion Control, Dresden University of Technology, Germany.

Stekl, Petr, and Kubiczek, Zdenek, *Low-Cost, 3-Phase, AC Motor Control System with Power Factor Correction Based on MC68HC908MR32*, Motorola Czech System Application Laboratory, Roznov pod Radhostem, Czech Republic, 2001.

(Continued)

*Primary Examiner*—Patricia Nguyen
(74) *Attorney, Agent, or Firm*—Ingrassia Fisher & Lorenz, P.C.

(57) ABSTRACT

Methods and apparatus are provided for driving a power amplifier load, such as a loudspeaker. The apparatus comprises a processor-controlled drive assembly configured as an H-bridge system. Groupings of half-bridge assemblies are connected to the load in an H-bridge structure, and are operated in pulse-width-modulation mode by the processor. The half-bridge assembly groupings receive time sliced commands from the processor in order to output a composite output signal to the load at a frequency higher than the operating frequency of a single half-bridge assembly. In general, the composite output frequency is the product of the individual half-bridge assembly operating frequency and the number of half-bridge assemblies in a grouping. As such, high frequency and high power output levels can be achieved using standard low-cost components.

13 Claims, 7 Drawing Sheets

OTHER PUBLICATIONS

De Mendonca, R.G., Neto, L. Martins, Camacho, J.R., *The Oscillating Torque On A Three-Phase Induction Generator Connected To A Single-Phase Distribution System*, Electrical Machines Laboratory, Electrical Engineering Department Universidade Federal de Uberlandia, Brazil.

Visinka, Radim, *Low Cost 3-Phase AC Motor Control System Based On MC68HC908MR24*, Roznov System Application Laboratory, Motorola, Czech Republic, 1998.

Brushless DC (BLDC) Motor, (online), Retrieved from Internet: <URL: www.motorola.com/webapp/sps/site/overview>.

3-Phase AC Induction Motor, (online), Retrieved from Internet: <URL www.motorola.com/webapp/sps/site/overview>.

* cited by examiner

HIGH FREQUENCY HIGH POWER H-BRIDGE POWER AMPLIFIER

TECHNICAL FIELD

The present invention generally relates to power amplifiers, and more particularly relates to high frequency high power audio amplifiers.

BACKGROUND

Power amplifiers are used in many application areas, including industrial and consumer electronics. One such application involves the amplification of audio power supplied to output devices, such as loudspeakers. For many low power applications, field effect transistors (FET's) are typically used in amplifier circuits due to their relatively high-speed switching capability. However, FET's generally become power limited in applications where the operating voltage is in the range of approximately 200 volts or higher.

One electronic switching device capable of higher power operation (i.e., in excess of 200 volts) is the insulated gate bipolar transistor (IGBT). While the IGBT can be used at power levels in the kilowatt range, the device has a relatively slow switching speed, with a typical upper frequency limit of approximately 20 kHz. As such, conventional power amplifier circuits using IGBT's would generally be limited in frequency to approximately 20 kHz.

Other switching devices having higher power and frequency capabilities may be considered for this type of power amplifier application, but the cost of such devices is typically many times higher than the cost of a standard IGBT, making the high-cost devices generally undesirable for production applications. Furthermore, as technology advances, it can be assumed that there will be an ongoing demand for power amplifiers that are capable of operating at higher frequencies and higher power levels. For example, there are current applications for a loudspeaker power amplifier requiring an operating frequency in the range of 60 kHz, with a minimum power level of 8 kilowatts. Therefore, there is a need for an audio power amplifier system capable of operating at high frequency and high power levels. Moreover, this type of power amplifier could be suitable for production applications if the switching elements were standard low-cost components, such as IGBT's.

Accordingly, it is desirable to provide a power amplifier system for applications requiring high (audio) frequency and high power capabilities. In addition, it is desirable to implement the power amplifier system with low-cost components for production applications. Furthermore, other desirable features and characteristics of the present invention will become apparent from the subsequent detailed description and the appended claims, taken in conjunction with the accompanying drawings and the foregoing technical field and background.

BRIEF SUMMARY

According to various exemplary embodiments, devices and methods are provided for frequency scaling the output of a pulse-width-modulated (PWM) power amplifier drive assembly configured as an H-bridge system. One method comprises the step of sequentially activating a grouping of half-bridge assemblies in the H-bridge system to generate a composite output signal to a load, where the frequency of the composite output signal is greater than the frequency capability of a single one of the half-bridge assemblies. In general, the frequency of the composite output signal is equal to the product of the frequency capability of a single one of the half-bridge assemblies and the number of half-bridge assemblies in a grouping.

One exemplary embodiment comprises a control system for scaling the pulse-width-modulated (PWM) frequency output of a power amplifier connected to a load. The control system includes a drive assembly configured as an H-bridge structure electrically connected to the load. The drive assembly is configured as a number of half-bridge assembly groupings, with each half-bridge assembly in a grouping containing switching elements having a maximum individual operating frequency. The switching elements are controlled by a processor that provides time sliced commands in a manner that enables the composite output signal frequency from the half-bridge assembly grouping to be greater than the maximum operating frequency of an individual switching element. Typically, the control system is configured so that the composite output frequency is equal to the product of the individual switching element operating frequency and the number of half-bridge assemblies in a grouping electrically connected to the load.

To achieve high power levels in conjunction with frequency scaling, devices such as IGBT's can be used for the switching elements in half-bridge assembly groupings. Thus, an exemplary embodiment of half-bridge assemblies using IGBT switching elements in an H-bridge configuration can achieve high power amplification in the audio frequency range. A further benefit of using IGBT's in production applications is that they are typically available commercially as standard low-cost components.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention pertain to the area of scaling the frequency capability of a power amplifier connected to a load, such as a loudspeaker system. Combining multiple groupings of half-bridge assemblies in an H-bridge configuration enables the composite output frequency of the power amplifier to exceed the frequency capability of the individual switching elements used in the half-bridge assemblies. As such, frequency scaling of the power amplifier can be achieved with standard low-cost components.

Figure 1:
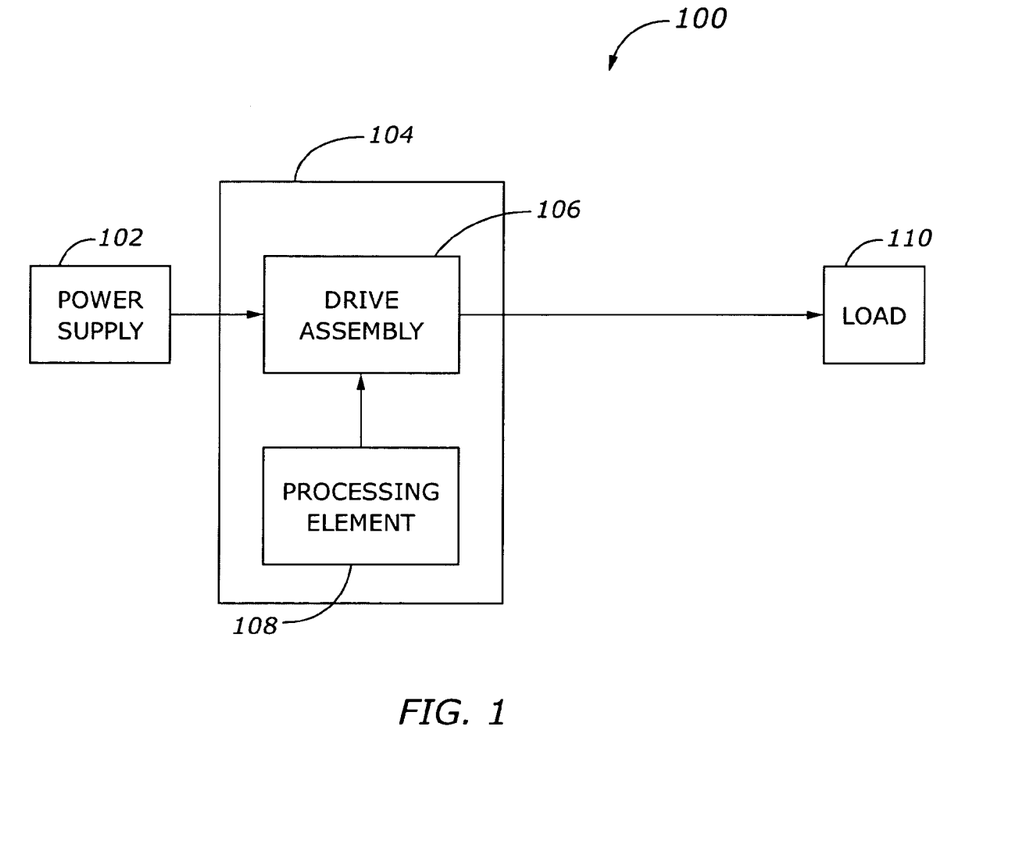
FIG. 1 is a block diagram of an exemplary control system for a power amplifier.

According to an exemplary embodiment of a system 100 for scaling the frequency capability of a power amplifier 104 connected to a load 110, as shown in FIG. 1, a processing element 108 provides command signals to a drive assembly 106 that is in electrical communication with the load 110. Processing element 108 may be any type of microprocessor, micro-controller, or other computing device capable of executing instructions in any computing language. A conventional power supply 102 provides power for the various components of power amplifier 104. Drive assembly 106 is generally configured to produce pulse-width-modulated (PWM) output signals to produce a desired current relationship in load 110.

Figure 2:
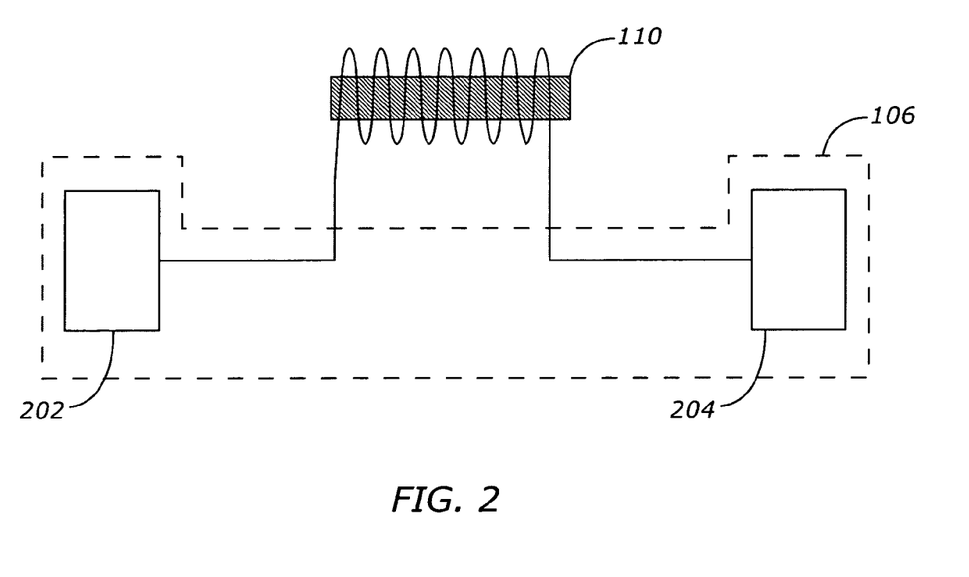
FIG. 2 is a block diagram of an exemplary H-bridge structure.

An exemplary embodiment of a basic power amplifier configuration is shown in FIG. 2. In this embodiment, drive assembly 106 is configured as an H-bridge structure with two half-bridge assemblies 202 and 204. This configuration does not include frequency scalability, since the PWM output frequency to load 110 from drive assembly 106 would typically be limited to the maximum frequency capability of each half-bridge assembly (202, 204).

Figure 3:
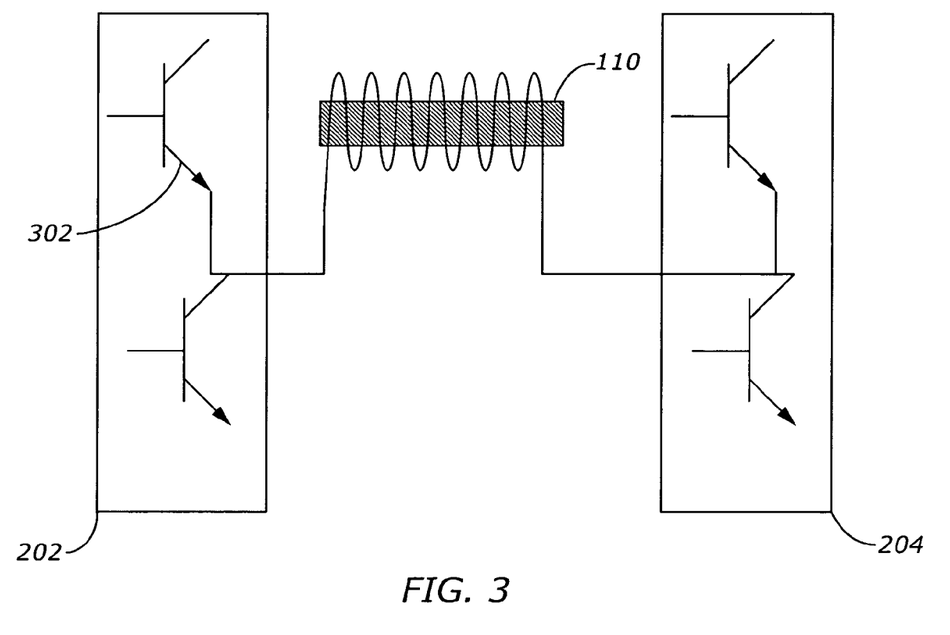
FIG. 3 is a schematic diagram of an exemplary H-bridge structure.

The H-bridge structure of FIG. 2 is shown schematically in FIG. 3, where each half-bridge assembly 202, 204 is comprised of two switching elements 302. Typically, switching elements 302 are triggered by commands from a controller, such as processing element 108 in FIG. 1, in order to produce a PWM output signal to load 110. The timing diagrams in FIG. 4 show a typical one-to-one frequency relationship between the individual switching elements 302 and the PWM output signal.

Figure 4:
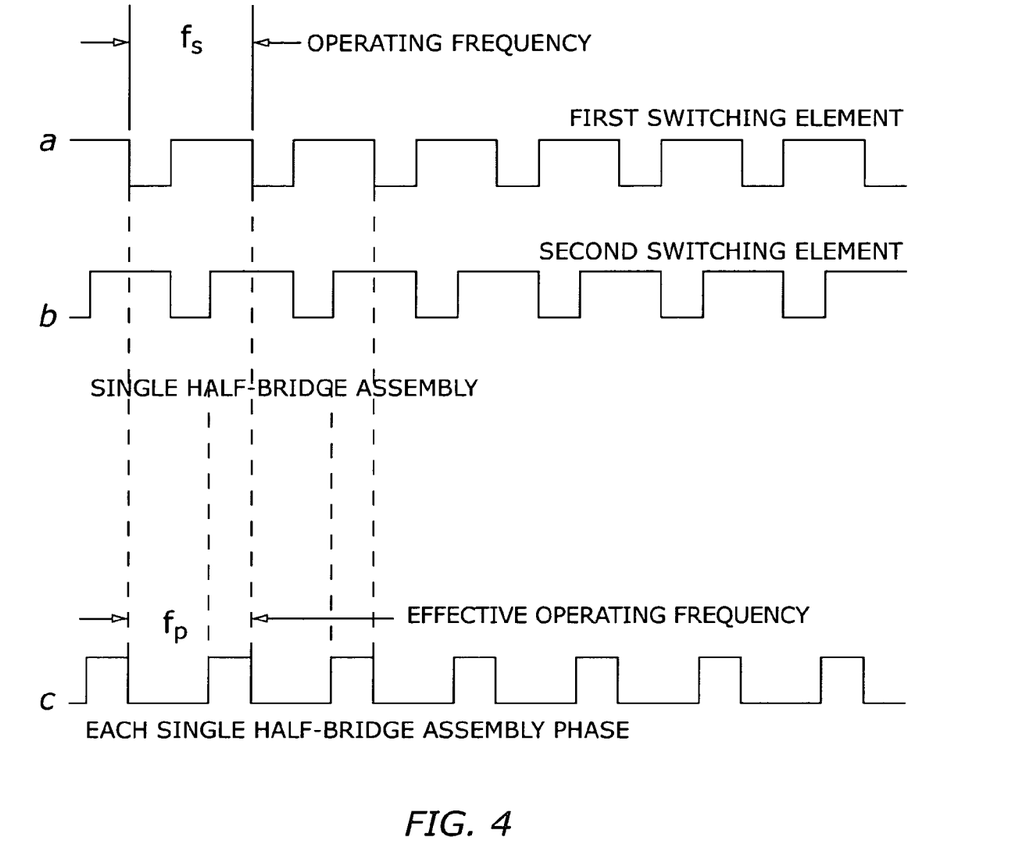
FIG. 4 is a timing diagram for the exemplary H-bridge structure of FIG. 3.

As shown in FIG. 4, lines a and b represent a typical half-bridge assembly timing arrangement, with an individual switching element operating frequency of $f_s$. The resultant output, as shown in line c, has an effective frequency $f_p$, which is essentially equal to $f_s$.

As previously noted in the Background section, field effect transistors (FET's) are often used as switching elements for high frequency (i.e., audio) applications, and are depicted schematically in FIG. 3. However, FET's are typically limited to an operating voltage range of approximately 200 volts, which makes them generally unsuitable for higher power applications. One type of switching element that is capable of higher power operation is the insulated gate bipolar transistor (IGBT). Due to its insulated gate structure, however, the IGBT is generally limited in switching speed to a range of approximately 20 kHz. Therefore, to achieve the previously stated objectives of high frequency and high power, a multiple configuration of IGBT half-bridge assemblies can be structured to provide frequency scaling in an H-bridge arrangement.

Figure 5:
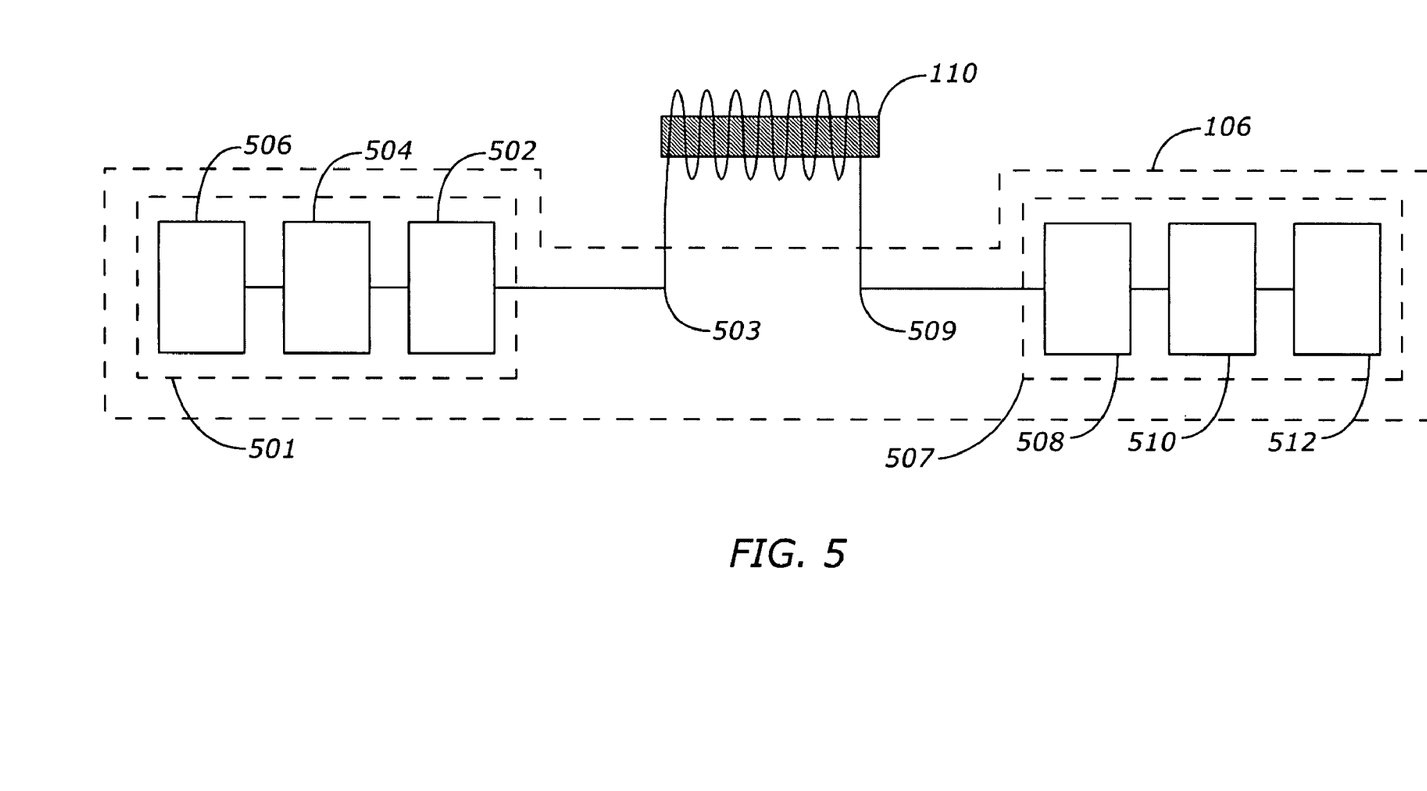
FIG. 5 is a block diagram of an exemplary composite H-bridge structure.

Referring now to FIG. 5, an exemplary embodiment of a frequency scaled H-bridge structure is shown in block diagram form. In this embodiment, drive assembly 106 includes two groupings (501, 507) of three half-bridge assemblies (502, 504, 506, and 508, 510, 512, respectively) in electrical communication with load 110. Each grouping 501, 507 is connected to a node (503, 509, respectively), and the nodes 503, 509 connect each grouping 501, 507 of respective half-bridge assemblies to opposite sides of load 110. As such, each grouping 501, 507 can provide the current of a single half-bridge assembly in the H-bridge structure, which is typically equivalent to the maximum continuous current capability of the individual switching elements in the half-bridge assemblies. In order to achieve the desired objective of frequency scaling, each half-bridge assembly (502, 504, 506, 508, 510, 512) in the exemplary configuration can be operated at a third of the desired output frequency to load 110, by time slicing the commands to each half-bridge assembly in the groupings 501, 507, as will be described below.

Figure 6:
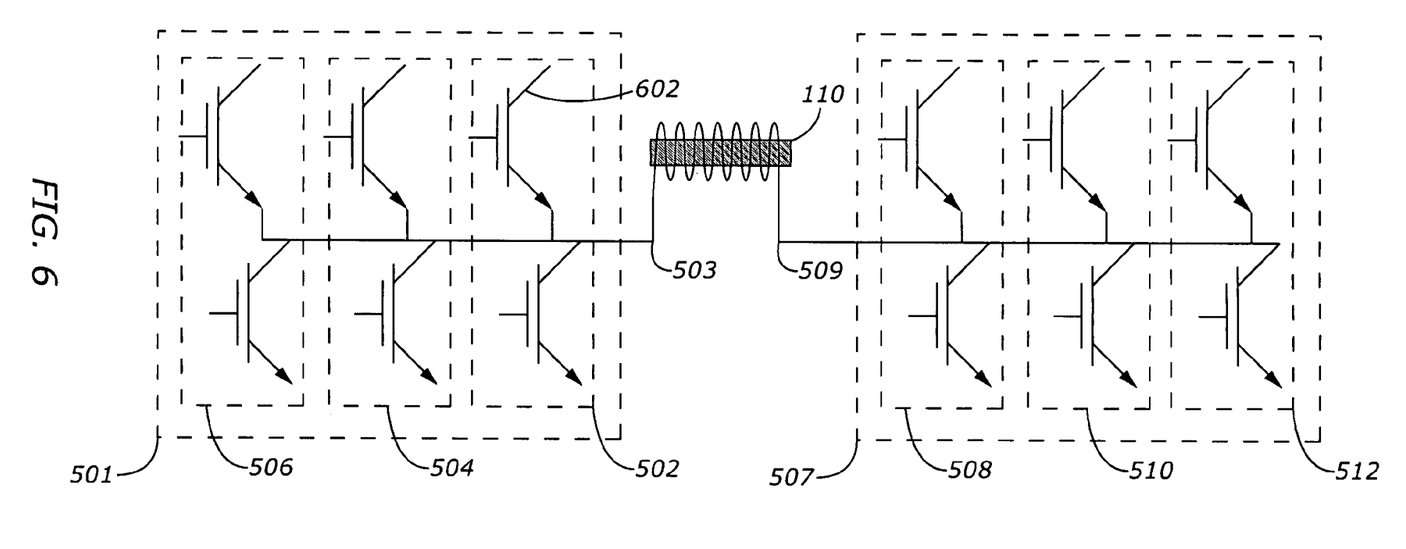
FIG. 6 is a schematic diagram of an exemplary composite H-bridge structure.

A schematic representation of the block diagram of FIG. 5 is shown in FIG. 6. In this exemplary embodiment, each half-bridge assembly (502, 504, 506, 508, 510, 512) is comprised of a pair of switching elements 602, which are depicted as IGBT's. As noted above, IGBT's can provide operational power capability at voltages in excess of 200 volts, but their switching speed is typically limited to 20 khz. With the exemplary multiple half-bridge assembly configurations shown in FIGS. 5 and 6, however, the output frequency to load 110 can be effectively three times the switching frequency of each half-bridge assembly, so that an output frequency of approximately 60 kHz can be achieved. While IGBT's are indicated herein as appropriate components for high power, high frequency applications, any suitable alternative device can be used, depending on the particular application requirements. For example, devices such as thyristors or mercury valves, among others, may also be considered as switching element possibilities for a high power frequency scaled type of H-bridge structure power amplifier.

Figure 7:
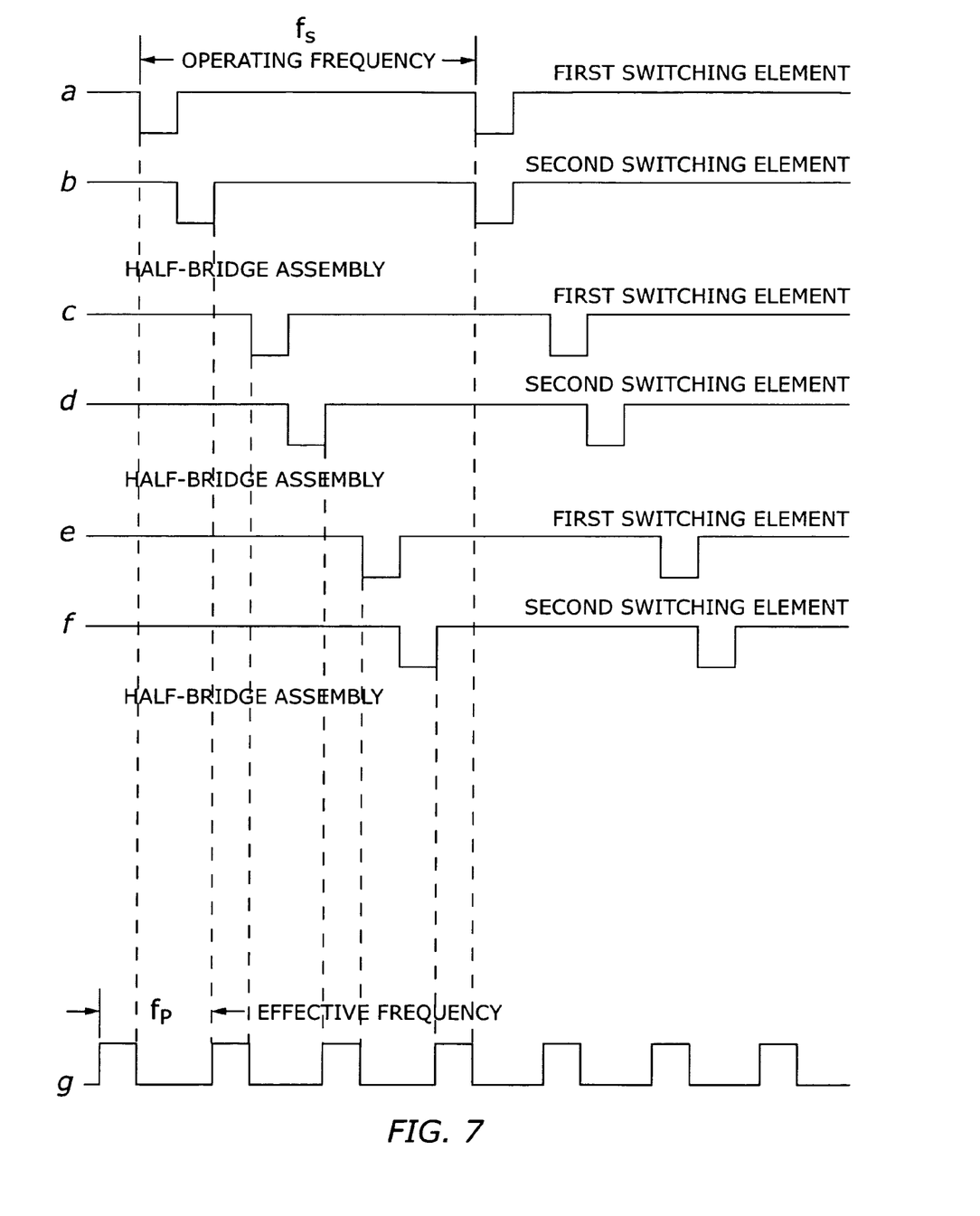
FIG. 7 is a timing diagram for the exemplary composite H-bridge structure of FIG. 6.

The basic operation of the exemplary multiple half-bridge assembly configuration of FIG. 6 is illustrated in the timing diagrams of FIG. 7. In the exemplary embodiment of FIG. 6, there are three half-bridge assemblies connected to a respective output node (e.g., 502, 504, 506 to node 503, and 508, 510, 512 to node 509) to provide a PWM output signal to load 110. The half-bridge assembly switching elements 602 are typically triggered by commands from a controller, such as processing element 108 in FIG. 1, in order to produce a PWM output signal to load 110. The 12 command signals used in this exemplary embodiment can be distributed to the 12 switching elements 602 via a device such as a Field Programmable Gate Array (FPGA), or the like. Other embodiments of half-bridge assemblies in H-bridge structures can be configured in various alternate but equivalent ways without departing from the general concepts set forth herein.

As illustrated in FIG. 7, the first and second switching elements 602 of each half-bridge assembly are operated in the same manner as previously described for a single half-bridge assembly 202, 204 in FIG. 4, where $f_s$ is the operating frequency of each switching element 602. However, in this exemplary embodiment, the switching elements of each half-bridge assembly are staggered in time relative to the switching elements in the other half-bridge assemblies of that grouping, as indicated in timing diagrams a through f. As a result, the composite frequency $f_p$, as shown in timing diagram g, is typically generated from each grouping (501, 507) of three half-bridge assemblies (502, 504, 506, and 508, 510, 512, respectively). In this embodiment, therefore, it follows that $f_p = 3 \times f_s$. Accordingly, if IGBT's are used as switching elements for this exemplary embodiment, a maximum frequency of approximately (3×20)=60 kHz can be achieved.

Moreover, the efficiency of a typical switching element can generally be increased if it is operated below its maximum frequency. As such, a grouping of half-bridge assemblies can be operated below the maximum switching frequency of its switching elements while still achieving a higher composite output frequency, since the output frequency is typically the product of the switching element operating frequency and the number of half-bridge assemblies in a grouping. Accordingly, the exemplary embodiments of FIGS. 5 and 6 can be used for both frequency scaling and for efficiency improvement.

The various examples disclosed herein are merely illustrative of various methods of arranging the half-bridge assemblies. In this regard, the half-bridge assemblies can be physically located in any one of a number of different manners with respect to one another. Moreover, various multiple half-bridge assembly configurations are available commercially, such as the model 4357 3-phase motor drive including three half-bridge assemblies, manufactured by M.S. Kennedy Corp. of Liverpool, N.Y.

Accordingly, the shortcomings of the prior art have been overcome by providing an improved method and apparatus for scaling the frequency of a high power amplifier. Sequential triggering of multiple half-bridge assemblies configured as groupings in an H-bridge structure enables the frequency scaling of a composite output signal to a load. Moreover, the disclosed exemplary frequency scaling technique allows the use of standard low-cost components for the switching elements in the half-bridge assemblies, and also enables the switching elements to operate at relatively high efficiencies.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of scaling the pulse-width-modulated (PWM) frequency output of a power amplifier drive assembly configured as an H-bridge system, comprising the step of:
   sequentially activating a plurality of half-bridge assemblies in the H-bridge system to generate a composite output signal to a load, wherein the frequency of the composite output signal is greater than the frequency capability of a single one of the half-bridge assemblies.

2. The method of claim 1 wherein the frequency of the composite output signal is equal to the product of the frequency capability of a single one of the half-bridge assemblies and the number of half-bridge assemblies in a grouping.

3. A control system for scaling the pulse-width-modulated (PWM) frequency output of a power amplifier connected to a load, the control system comprising:
   a drive assembly configured as an H-bridge system in electrical communication with the load, the drive assembly comprising a plurality of half bridge assembly groupings, each half-bridge assembly grouping being comprised of a plurality of half-bridge assemblies, with each half-bridge assembly comprised of switching elements capable of operating at a first frequency;
   a processor in electrical communication with the drive assembly, the processor configured to control the operation of the switching elements in the half-bridge assemblies, wherein each grouping of the half-bridge assemblies is configured to generate pulse-width-modulated signals into the load at a second frequency that is higher than the first frequency; and
   a power supply configured to supply power to the drive assembly and to the processor.

4. The control system of claim 3 wherein the second frequency is equal to the product of the first frequency and the number of half-bridge assemblies in a grouping electrically connected to the load.

5. The control system of claim 3 wherein the switching elements comprise insulated gate bipolar transistors (IGBT's).

6. The control system of claim 3 wherein the load comprises a loudspeaker system.

7. A drive assembly for providing a pulse-width-modulated input signal to a load, comprising:
   a plurality of half-bridge assemblies that each include two switching elements capable of operating at no more than a predetermined frequency and a predetermined current level, wherein at least two half-bridge assemblies in a grouping are electrically connected to the load, such that the at least two half-bridge assemblies are capable of providing a pulse-width-modulated input voltage to the load at a frequency higher than the predetermined frequency and at a current level equal to the predetermined current level.

8. The drive assembly of claim 7 wherein the switching elements comprise insulated gate bipolar transistors (IGBT's).

9. The drive assembly of claim 7 wherein the load comprises a loudspeaker system.

10. The drive assembly of claim 7 wherein the at least two half-bridge assemblies in a grouping that are electrically connected to the load are capable of providing the pulse-width-modulated input voltage to the load at a frequency equal to the product of the number of half-bridge assemblies in a grouping electrically connected to the load and the predetermined operating frequency of the switching elements.

11. A method of scaling the pulse-width-modulated (PWM) frequency output of a power amplifier drive assembly configured as an H-bridge system, comprising the step of:
   sequentially activating a plurality of half-bridge assemblies in the H-bridge system to generate a composite output signal to a load, wherein each of the half-bridge assemblies comprises insulated gate bipolar transistors (IGBT's), wherein the frequency of the composite output signal is greater than the frequency capability of a single one of the half-bridge assemblies, and wherein the frequency of the composite output signal is equal to the product of the frequency capability of a single one of the half-bridge assemblies and the number of half-bridge assemblies in a grouping.

12. A control system for scaling the pulse-width-modulated (PWM) frequency output of a power amplifier connected to a load, the control system comprising:
   a drive assembly configured as an H-bridge system in electrical communication with the load, the drive assembly comprising a plurality of half-bridge assembly groupings, each half-bridge assembly grouping being comprised of a plurality of half-bridge assemblies, with each half-bridge assembly comprised of insulated gate bipolar transistors (IGBT's) capable of operating at a first frequency;
   a processor in electrical communication with the drive assembly, the processor configured to control the operation of the insulated gate bipolar transistors (IG- BT's) in the half-bridge assemblies, wherein each grouping of the half-bridge assemblies is configured to generate pulse-width-modulated signals into the load at a second frequency that is higher than the first frequency, wherein the second frequency is equal to the product of the first frequency and the number of half-bridge assemblies in a grouping electrically connected to the load; and a power supply configured to supply power to the drive assembly and to the processor.

13. A drive assembly for providing a pulse-width-modulated input signal to a load, comprising:

a plurality of half bridge assemblies that each include two insulated gate bipolar transistors (IGBT's) capable of operating at no more than a predetermined frequency and a predetermined current level, wherein at least two half-bridge assemblies in a grouping are electrically connected to the load, such that the at least two half-bridge assemblies are capable of providing a pulse-width-modulated input voltage to the load at a frequency higher than the predetermined frequency and at a current level equal to the predetermined current level, and wherein the at least two half-bridge assemblies in a grouping that are electrically connected to the load are capable of providing the pulse-width-modulated input voltage to the load at a frequency equal to the product of the number of half-bridge assemblies in a grouping electrically connected to the load and the predetermined operating frequency of the insulated gate bipolar transistors (IGBT's).

* * * * *